United States Patent [19]
Knapp et al.

[11] Patent Number: 6,067,339
[45] Date of Patent: May 23, 2000

[54] FREQUENCY DIVIDER WITH LOWER POWER CONSUMPTION

[75] Inventors: Herbert Knapp; Wilhelm Wilhelm, both of Munich, Germany

[73] Assignee: Siemens Aktiengesellschaft, Munich, Germany

[21] Appl. No.: 09/153,060

[22] Filed: Sep. 15, 1998

[30] Foreign Application Priority Data

Sep. 18, 1997 [DE] Germany ............................ 197 41 210

[51] Int. Cl.[7] .................................................. H03K 21/00
[52] U.S. Cl. .......................... 377/47; 327/115; 327/117; 377/48
[58] Field of Search ................... 327/115, 117; 377/47, 48

[56] References Cited

U.S. PATENT DOCUMENTS

| 4,606,059 | 8/1986 | Oida | ............................................. | 377/47 |

FOREIGN PATENT DOCUMENTS

| 35 03 182 | 8/1986 | Germany . |
| 63-151217 | 6/1988 | Japan . |
| 3-4618 | 1/1991 | Japan . |
| 5-48433 | 2/1993 | Japan . |
| 5-90953 | 4/1993 | Japan . |
| 6-2584765 | 9/1994 | Japan . |
| 7-221633 | 8/1995 | Japan . |

OTHER PUBLICATIONS

"10GHz GaAs JFET Dual–Modulus Prescaler IC," Kasahara et al., Electronics Letters, vol. 25, No. 14, Jul. 6, 1989, pp. 889–890.

"A 1.75–Ghz/3–V Dual–Modulus Divide–by–128/129 Prescaler in 0.7 λm CMOS," Craninckx et al., IEEE J. of Solid–State Circuits, vol. 31, No. 7, Jul., 1996, pp. 890–897.

Patent Abstracts of Japan, vol. 018, No. 270 (E–1552), May 23, 1994, for Japanese Application 04197982.

"A Sub–1 mA 1.5–GHz Silicon Bipolar Dual Modulus Prescaler," Seneff et al, IEEE J. of Solid–State Circuits, vol. 29, No. 10, Oct. 1994, pp. 1206–1211.

"A 3–mW 1.0–GHz Silicon–ECL Dual–Modulus Prescaler IC," Mizuno et al, IEEE J. of Solid–State Circuits, vol. 27, No. 12, Dec. 1992, pp. 1794–1798.

"Digitale Schaltungen," Seifart (1990), pp. 168–178.

*Primary Examiner*—Timothy P. Callahan
*Assistant Examiner*—Cassandra Cox
*Attorney, Agent, or Firm*—Hill & Simpson

[57] ABSTRACT

A frequency divider such as a dual modulus prescaler has a division factor switchable between 1/N and 1/(N+1) and an input frequency of approximately 1 GHz as occurs, for example, in mobile telecommunication systems (GSM or DECT telephones). Low power consumption is achieved by using only the input flipflop to process the relatively high input frequency and an intermediate signal having only half the frequency is supplied to an intermediate divider and an output signal is already taken at a penultimate stage of a divider expansion connected following the intermediate divider.

3 Claims, 3 Drawing Sheets

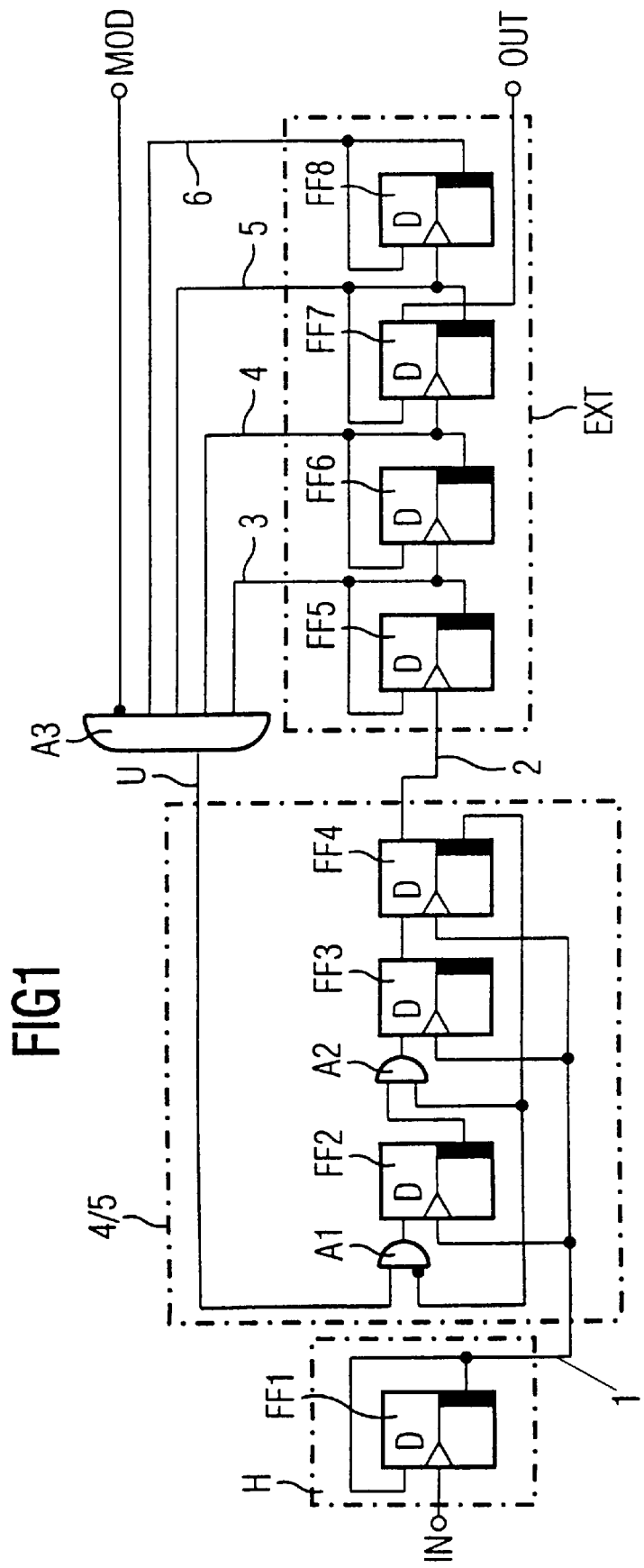

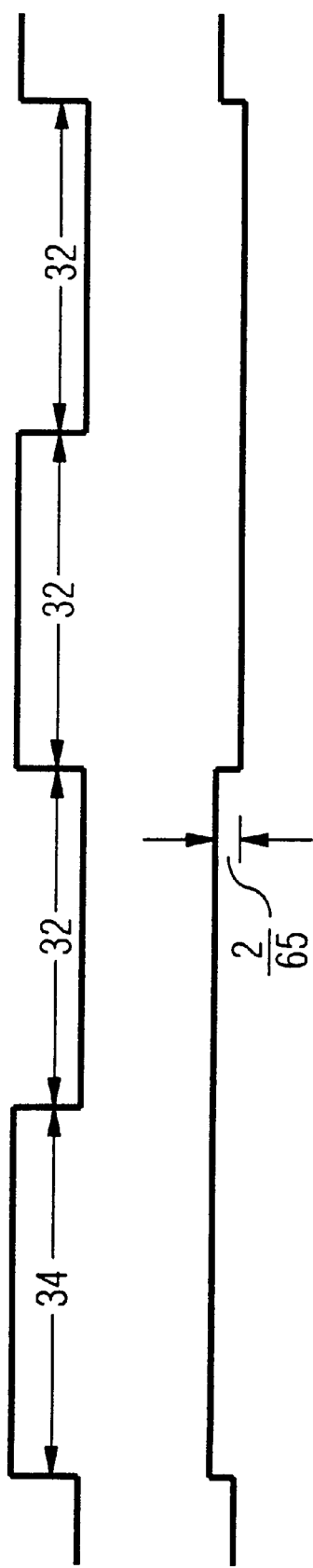

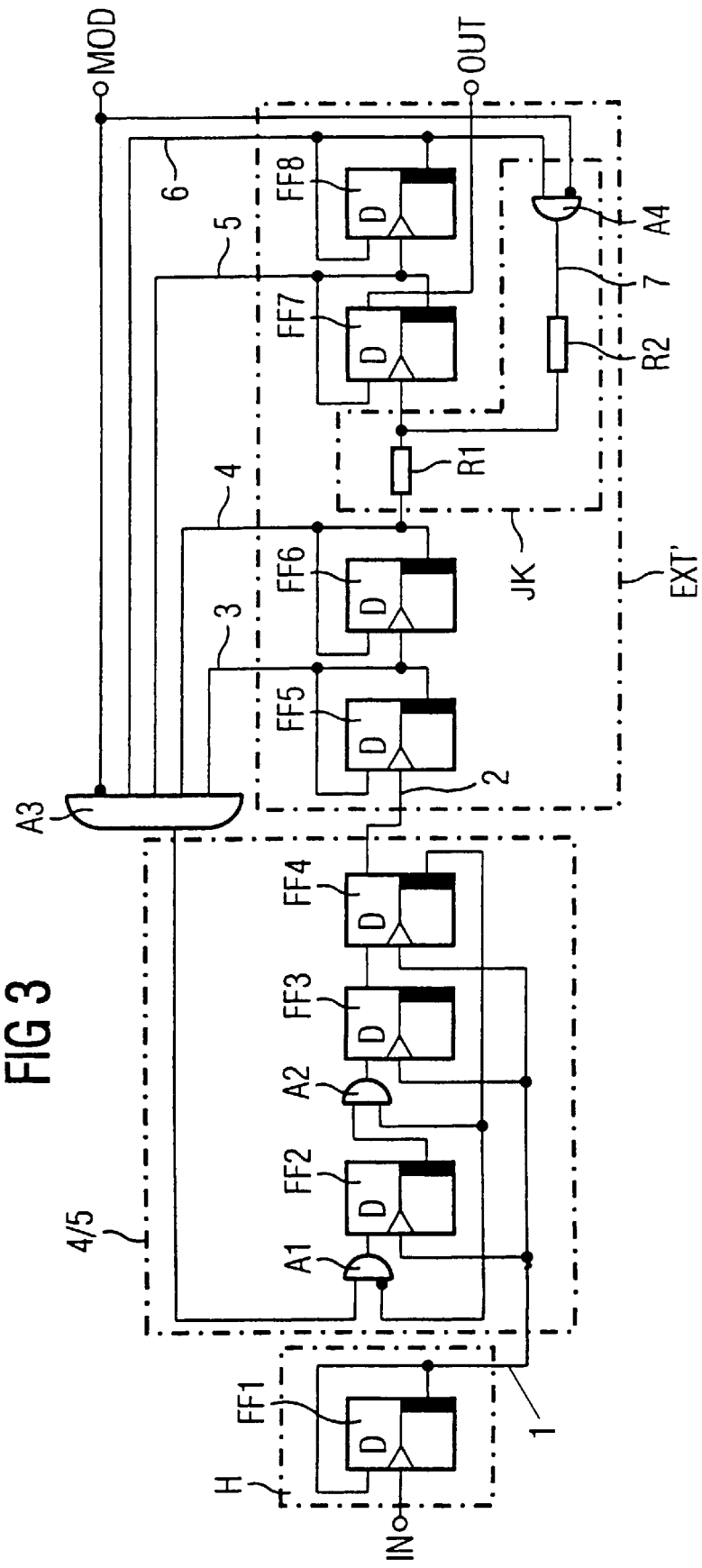

6,067,339

FREQUENCY DIVIDER WITH LOWER POWER CONSUMPTION

BACKGROUND OF THE INVENTION

1. Field of the Invention

The present invention is directed to a frequency divider of the type employed in mobile telecommunication systems, and is directed particularly to a type of frequency divider known as a "dual modulus prescaler".

2. Description of the Prior Art

Frequency dividers of the type known as dual modulus prescalers are employed in frequency synthesizers of mobile telecommunication systems. Such frequency dividers have division factors switchable between 1/N and 1/(N+1), whereby N typically amounts to 64 or 128, and operate at frequencies on the order of magnitude of 1 GHz and are a component of every GSM or in DECT telephone. Since such telephones are usually batter-powered, the importance of low power consumption by all components, including the frequency divider, is significant.

Examples of the employment and the structure of such prescalers are known from the IEEE Journal of Solid-State Circuits, Vol. 29, No. 10, October, 1994, pages 1206 through 1211 as well as Vol. 27, No. 12, December, 1992, pages 1794 through 1798, wherein asynchronous divider expansion stages follow a respectively synchronous 1:4/5 divider.

SUMMARY OF THE INVENTION

An object of the present invention is to provide a frequency divider of the above-described type that exhibits an especially low power consumption.

The above object is achieved in a frequency divider constructed in accordance with the principles of the present invention having a frequency halver, to which an input signal having a frequency f is supplied, which forms an intermediate signal with only the frequency f/2 from the input signal, an intermediate divider which, dependent on a switching signal, generates a second intermediate signal having the frequency f/8 from the first intermediate signal if division by a factor 1/N is desired by reducing the frequency of the first intermediate signal by a division factor of 1/4, and which generates a second intermediate signal having the frequency f/10 from the first intermediate signal if division by a factor of 1/(N+1) is desired by reducing the frequency of the first intermediate signal by a division factor of 1/5, a divider expansion with $2^{N-2}$ divider stages including a penultimate divider stage which supplies an output signal with the frequency f/N or f/(N+1), and a logic circuit which generates the aforementioned switching signal from a control signal and output signals of the stages of the divider expansion.

In an embodiment, a jitter compensation circuit can be provided in the divider expansion. If the number of divider stages in the divider expansion is even, so that the divider stages can be grouped into a first half of stages and a second half of stages, the jitter compensation circuit can add an output signal from a last divider stage of the second half of divider stages with a clock signal for a first stage in the second half of the divider stages.

DESCRIPTION OF THE DRAWINGS

FIG. 1 is a circuit diagram of a preferred exemplary embodiment of the inventive frequency divider.

FIG. 2 shows time diagrams for explaining the functioning of the circuit of FIG. 1.

FIG. 3 is a circuit diagram of another preferred exemplary embodiment of the inventive frequency divider.

DESCRIPTION OF THE PREFERRED EMBODIMENTS

In accordance with the invention, an intermediate signal with the frequency f/2 is initially formed from the input signal IN with the frequency f by a frequency halver before this signal, as in the prior art, is supplied to a 1:4/5 divider. Further, the output signal of a penultimate stage of an expansion divider is employed as the output signal of the frequency divider instead of the output signal of a last stage. This results in only one flipflop being operated with the maximum frequency f=1 GHz, and, thus, a noticeable reduction of the overall power consumption of the frequency divider can be achieved. Since a pre-amplifier for driving the clock lines of the intermediate 1:4/5 divider can be foregone under certain circumstances, this leads to a further power reduction.

As an example, FIG. 1 shows a frequency divider for the division factors 1/64 and 1/65, having an input-side frequency halver H, an intermediate divider 4/5 and a divider expansion EXT. The input-side frequency halver H generates an intermediate signal 1 exhibiting only the frequency f/2 from an input signal IN having the frequency f. Dependent on a switchover signal U the intermediate divider 4/5 generates a second intermediate signal 2 with the frequency f/8 from the first intermediate signal in the case of a desired division factor 1/N, by reducing the frequency with the division factor 1/4 and, given a desired division factor 1/(N+1), generates the intermediate signal 2 with the frequency f/10 from the first intermediate signal by reducing the frequency with the division factor 1/5. The divider expansion EXT contains $2^{N-2}$ divider stages (FF5 . . . FF8) whose penultimate divider stage FF7 supplies an output signal OUT with the frequency f/N, or f/(N+1). The switchover signal U is formed by an AND gate A3 from a negated control signal MOD and from the negated output signals 3 . . . 6 of the respective divider stages FF5 . . . FF8. The frequency halver H is fashioned such that the input signal IN of the frequency divider serves as the clock signal for a D-flipflop FF1 therein, whose inverted output carries the signal 1 which is fed back onto the D-input. The intermediate divider 4/5 contains three flipflops FF2 . . . FF4 synchronously clocked by the signal 1, with the D-input of the flipflop FF2 being connected to an AND gate A1 that operates on the switchover signal U. The D-input of the flipflop FF3 being connected to an AND gate A2 that operates on a negated output signal of the flipflop FF2 with a negated output signal of the flipflop FF4, and the non-inverted output of the flipflop FF3 is connected to the D-input of the flipflop FF4. The flipflops FF5 . . . FF8 of the divider expansion EXT are connected here as asynchronous counters, with the respective clock inputs of the D-flipflops FF6 . . . FF8 being connected to the inverted output of the predecessor stage, and the clock input of the flipflop FF5 receiving the signal 2. All flipflops FF1 . . . FF8 are D-flipflops with a clock input triggering at positive signal edges. Due to the input-side frequency halving, a division by 128 or 130 arises at the output of the last stage of the expansion divider EXT. The desired division by 64 or 65 is achieved by taking the output signal OUT at the output of the penultimate stage of the expansion divider EXT.

FIG. 2 shows the output signal OUT of the circuit shown in FIG. 1, wherein 34 periods with high level are followed by 32 periods with low level, followed by 32 periods of high level and, finally, another 32 periods of low level. In addition to the desired fundamental, an analysis of this signal shows a further signal with half the output frequency and amplitude 2/65. This corresponds to an undesired superimposition of a noise voltage (jitter) with the frequency of the fundamental of the output signal.

For eliminating this undesired jitter, a further preferred exemplary embodiment of the invention is shown in FIG. 3 wherein a jitter at the output OUT is avoided by a modified divider expansion EXT' with a jitter compensation circuit JK. Except for the modified divider expansion EXT' instead of the divider expansion EXT, the circuit of FIG. 3 corresponds to the circuit of FIG. 1. The jitter compensation circuit JK is formed, for example, by a resistor R1 that connects the inverted output signal 4 of the flipflop FF6 to the clock input of the flipflop FF7, and an AND gate A4 which emits a signal 7 that is supplied to the clock input of the flipflop FF7 via a further resistor R2. The signal 7 is formed by the AND gate A4 operating on the inverted output signal of the flipflop FF8 and the inverted control signal MOD. This results in a signal having the amplitude −2/65 with half the frequency of the output signal being mixed with the signal 4 and the jitter is thereby eliminated.

Given an even number of divider expansion stages, so that the stages can be grouped as a first half of the stages and a second half of the stages, the jitter compensation circuit JK is in general constructed so that a signal dependent on the output signal of the last divider stage, such as FF8 is added with a clock signal for a first stage, such as FF7, of the second half of the divider stages, such as FF7, FF8 following the first half of the divider stages, such as FF5, FF6.

Although modifications and changes may be suggested by those skilled in the art, it is the intention of the inventors to embody within the patent warranted hereon all changes and modifications as reasonably and properly come within the scope of their contribution to the art.

We claim as our invention:

1. A frequency divider comprising:

a frequency halver, supplied with an input signal having a frequency f, which generates a first intermediate signal having only a frequency f/2 from said input signal;

a logic circuit supplied with a control signal indicating whether overall frequency division is selected as f/N or f/(N+1), said logic circuit emitting a switching switchover signal dependent on the selected division;

an intermediate divider, supplied with said first intermediate signal from said frequency halver and with said switching signal from said logic circuit, for generating a second intermediate signal having a frequency f/8 from said first intermediate signal if division by 1/N is selected, by reducing the frequency of said first intermediate signal with a division factor of 1/4, and for generating a second intermediate signal having a frequency f/10 from said first intermediate signal if division by 1/(N+1) is selected, by reducing the frequency of said first intermediate signal with a division factor of 1/5;

a divider expansion, supplied with the second intermediate signal from said intermediate divider, containing $2^{N-2}$ divider stages including a penultimate divider stage, said penultimate divider stage emitting an output signal exhibiting jitter and having the frequency f/N or f/(N+1) dependent on said control signal, each of said divider stages in said divider expansion emitting a respective output signal, said divider expansion including jitter compensation means for reducing said jitter; and said logic circuit combining the respective output signals of the divider stages of said divider expansion with said control signal to generate said switching signal.

2. A frequency divider as claimed in claim 1 wherein said divider expansion contains an even number of said divider stages grouped into a first half of divider stages and a second half of divider stages, and wherein said jitter compensation means comprises means for adding a signal dependent on an output of a last divider stage in said second half of divider stages with a clock signal for a first divider stage in said second half of divider stages.

3. A frequency divider as claimed in claim 2 wherein said divider expansion comprises an asynchronous divider having four divider stages; and wherein said jitter compensation means comprises a first resistor connected between an input of a third of said divider stages and an output of a second of said divider stages, an AND gate supplied with an inversion of said control signal and an output of a fourth of said divider stages, and a second resistor connected to an output of said AND gate and to said input of said third of said divider stages.

* * * * *